(12) United States Patent
Mineji (10) Patent No.: US 7,259,056 B2
(45) Date of Patent: Aug. 21, 2007

(54) METHOD FOR MANUFACTURING SEMICONDUCTOR DEVICE

(75) Inventor: Akira Mineji, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 333 days.

(21) Appl. No.: 11/003,493

(22) Filed: Dec. 6, 2004

(65) Prior Publication Data

US 2006/0008964 A1    Jan. 12, 2006

(30) Foreign Application Priority Data

Jul. 7, 2004    (JP)    ............... 2004-200443

(51) Int. Cl.
H01L 21/8238    (2006.01)

(52) U.S. Cl. ............ 438/231; 438/308; 438/259; 438/275; 257/E21.497; 257/E21.619; 257/E21.621; 257/E21.627; 257/E21.634

(58) Field of Classification Search .......... 438/231, 438/232, 275, 276, 289, 302, 303, 305, 306, 438/307, 308, 663; 257/E21.497, E21.619, 257/E21.621, E21.627, E21.634
See application file for complete search history.

(56) References Cited

U.S. PATENT DOCUMENTS 5,981,347 A  *  11/1999  Kuo et al. ............ 438/308
6,677,194 B2  *  1/2004  Yamanaka et al. ...... 438/199
6,767,796 B2       7/2004  Tanaka et al.
2002/0068407 A1    6/2002  Ono
2003/0013280 A1    1/2003  Yamanaka
2003/0193066 A1   10/2003  Ito et al.
2004/0018702 A1    1/2004  Ito et al.

FOREIGN PATENT DOCUMENTS

| JP | 2000-208758 | 7/2000 |
| JP | 2000-340677 | 12/2000 |
| JP | 2002-118078 | 4/2002 |
| JP | 2002-151428 | 5/2002 |
| JP | 2002-176172 | 6/2002 |
| JP | 2002-246328 | 8/2002 |
| JP | 2002-252174 | 9/2002 |
| JP | 2003-309079 | 10/2003 |
| JP | 2004-063574 | 2/2004 |

* cited by examiner

Primary Examiner—George R. Fourson
Assistant Examiner—Julio J. Maldonado
(74) Attorney, Agent, or Firm—Leydig, Voit & Mayer, Ltd.

(57) ABSTRACT

In a method for manufacturing a semiconductor device, gate insulation films and gate electrodes are first formed on a substrate. An impurity is implanted into each gate electrode. Next, a first heat treatment is performed to the substrate for diffusing the impurity in the gate electrodes. After the heat treatment, a second heat treatment is performed for releasing stress generated in the substrate in the first heat-treatment. Thereafter, an impurity is implanted into an area to become an implanted region of the substrate, using the gate electrodes as masks, and a third heat treatment is performed for activating the impurity implanted.

8 Claims, 7 Drawing Sheets

METHOD FOR MANUFACTURING SEMICONDUCTOR DEVICE

BACKGROUND OF THE INVENTION

1. Field of the Invention

The present invention relates to a method for manufacturing a semiconductor device. Particularly, the present invention is suitable for manufacturing a transistor.

2. Background Art

A generally practiced conventional method for manufacturing a transistor will be described.

First, a polycrystalline silicon (poly-Si) film that becomes the material for a gate electrode is deposited, and appropriate ions are implanted therein. Thereafter, the poly-Si film is processed to have the shape of the gate electrode; impurity ions are implanted into an area to become a source-drain extension (hereafter briefly referred to as extension) using the poly-Si gate electrode as a mask; and annealing is performed for activating the impurity using a flash lamp. Next, a gate sidewall is formed, and then, ions are implanted into areas to become source-drain regions using the poly-si gate electrode and the sidewall as masks. Here, in order to sufficiently diffuse the impurity implanted in the poly-si gate electrode, heat treatment, such as RTA (rapid thermal annealing) is performed. Then, annealing is further performed for activating the impurity implanted in the source-drain regions and the gate electrode using a flash lamp.

In the above-described method, the reason why an impurity is implanted into poly-Si, which is the material for the gate electrode, is to control the work function of the gate electrode, and to lower the threshold voltage. In order to lower the threshold voltage, it is desirable that the gate electrode is doped with a large quantity of the impurity and this impurity is diffused in the gate electrode. Therefore, in the above-described method, it is considered that the heat treatment using RTA for diffusing the impurity is performed at a temperature of about 800° C. or above for several seconds.

On the other hand, in the source-drain region, a shallow junction of the diffusion region is desired. Here, in order to form a shallow diffusion region, ion implantation at a low acceleration, and the optimization of the annealing treatment for activating the impurity after ion implantation, are important. Specifically, when the annealing treatment after ion implantation is performed at a high temperature and for a short time, the impurity is diffused inwardly and outwardly. On the other hand, if the annealing temperature is lowered for preventing diffusion, the impurity cannot be sufficiently activated. Therefore, as a method for instantaneously supplying energy required for activation, annealing using a flash lamp is used also in the above-described method for forming a transistor. The use of the flash lamp enables light emitting within the range between several hundred microseconds and several milliseconds, and the activation of the impurity without changing the distribution of implanted impurity ions.

Here, as a method for accurately controlling the profile of the impurity, implantation of Ge (germanium) ions before or after implanting B (boron) ions has also been considered (e.g., refer to Japanese Patent Application Laid-Open No. 2003-309079)

However, as described above, in order to sufficiently diffuse the impurity ions in the gate electrode, heat treatment with RTA must be performed at 800° C. or above for several seconds. However, if heat treatment is performed under such conditions, it is considered that the impurity implanted into the extension may be redistributed, or at least the impurity activated by flash-lamp annealing may be inactivated.

It is also considered that the impurity implanted into the source-drain region is diffused by RTA; therefore, the punch through between the source and the drain must be prevented. Therefore, the width of the gate sidewall must be sufficiently enlarged, causing a problem in a semiconductor device requiring miniaturization.

Although flash-lamp annealing is performed after RTA for activating the impurity in the source-drain region, if flash-lamp annealing is performed in the state having stress of the Si substrate produced during RTA, a defect such as slipping may occur in the Si substrate, or the Si substrate may be damaged.

SUMMARY OF THE INVENTION

The object of the present invention is to solve the above problems, and to provide a method for manufacturing a semiconductor device improved to be able to sufficiently diffuse an impurity in the gate electrode, and to sufficiently activate the diffusion region while suppressing damage to the Si substrate.

According to one aspect of the present invention, in a method for manufacturing a semiconductor device, a gate insulation film and a gate electrode are formed on a substrate. Impurities are implanted into the gate electrode. A first heat-treatment is performed to diffuse the impurities in the gate electrode. A second heat-treatment is performed to release stress generated in the substrate in the first heat-treatment. Impurities are implanted into the substrate to form a diffusion region using the gate electrode as a mask. A third heat-treatment is performed to activate the impurities implanted into the diffusion region.

Other and further objects, features and advantages of the invention will appear more fully from the following description.

DESCRIPTION OF THE PREFERRED EMBODIMENTS

The embodiments of the present invention will be described below referring to the drawings. In the drawings, the same or corresponding parts are denoted by the same reference numerals and characters, and the description thereof will be simplified or omitted.

First Embodiment

Figure 1:
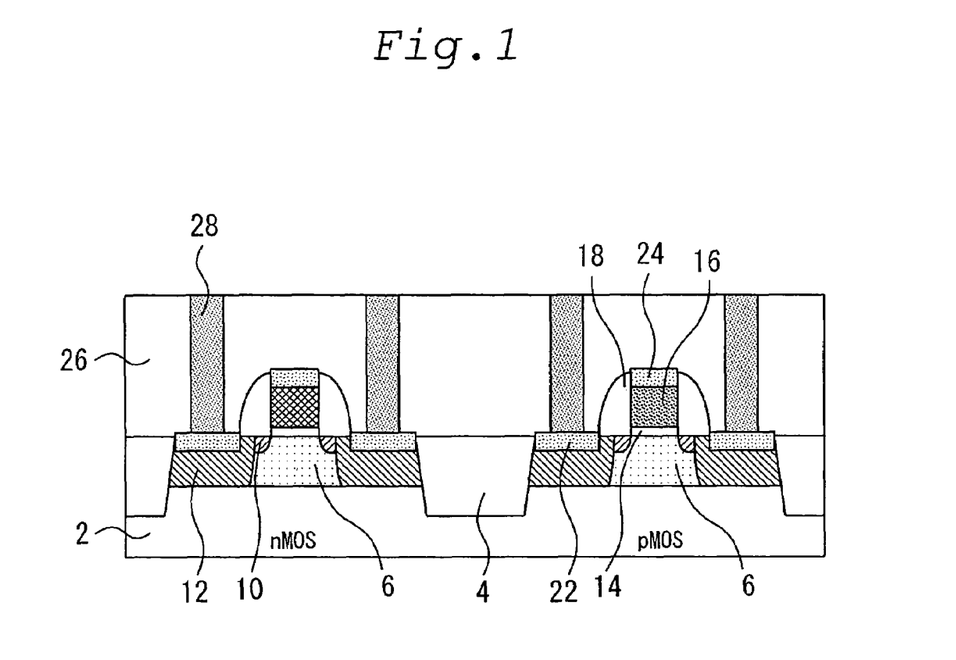
FIG. 1 is a schematic sectional view for illustrating a semiconductor device according to the first embodiment of the present invention.

FIG. 1 is a schematic sectional view for illustrating a semiconductor device according to the first embodiment of the present invention.

The semiconductor device according to the first embodiment is a CMOSFET (complementary metal oxide semiconductor field effect transistor, hereafter referred to as CMOS), wherein an n-type MOSFET (hereafter referred to as n-MOS) and a p-type MOSFET (hereafter referred to as p-MOS) are formed on a substrate.

For the simplifying description, in this specification, the region for forming an n-MOS is referred to as an n-MOS region, and the region for forming a p-MOS is referred to as a p-MOS region.

As FIG. 1 illustrates, an Si substrate 2 is divided into an n-MOS region and a p-MOS region by an element-isolating region 4. In the n-MOS region and the p-MOS region, p-type and n-type wells 6 wherein p-type and n-type impurities are implanted are formed, respectively. In each region, an extension 10 is formed on the surface of the Si substrate. The extension 10 is a diffusion region having a shallow junction depth and a low impurity concentration. Source-drain regions 12 are formed outside the extension 10. The source-drain regions 12 are diffusion regions having a deeper junction depth and higher impurity concentration than extension 10.

Gate insulation films 14 are formed on the areas between extensions 10 on the Si substrate 2. The gate insulation films 14 are SiON films. On the gate insulation films 14 are formed gate electrodes 16. The gate electrodes 16 in the n-MOS and p-MOS regions are composed of poly-Si wherein n-type and p-type impurities are implanted, respectively. Gate sidewalls 18 are formed on the sides of the gate electrodes 16 and the gate insulation films 14. On the surface of the gate electrodes 16, and on the area of the Si substrate 2 whereon gate electrodes 16 and gate sidewalls 18 are not formed, specifically on the surfaces of the source-drain regions 12, NiSi layers 22 and 24 are formed, respectively.

An interlayer insulation film 26 is formed so as to embed thus constituted gate electrodes 16, the gate sidewalls 18 and the like. In the interlayer insulation film 26, contact plugs 28 extending to the NiSi layers 22 on the source-drain regions 12 are formed from the surface of the interlayer insulation film 26 passing through the interlayer insulation film 26.

Figure 2:
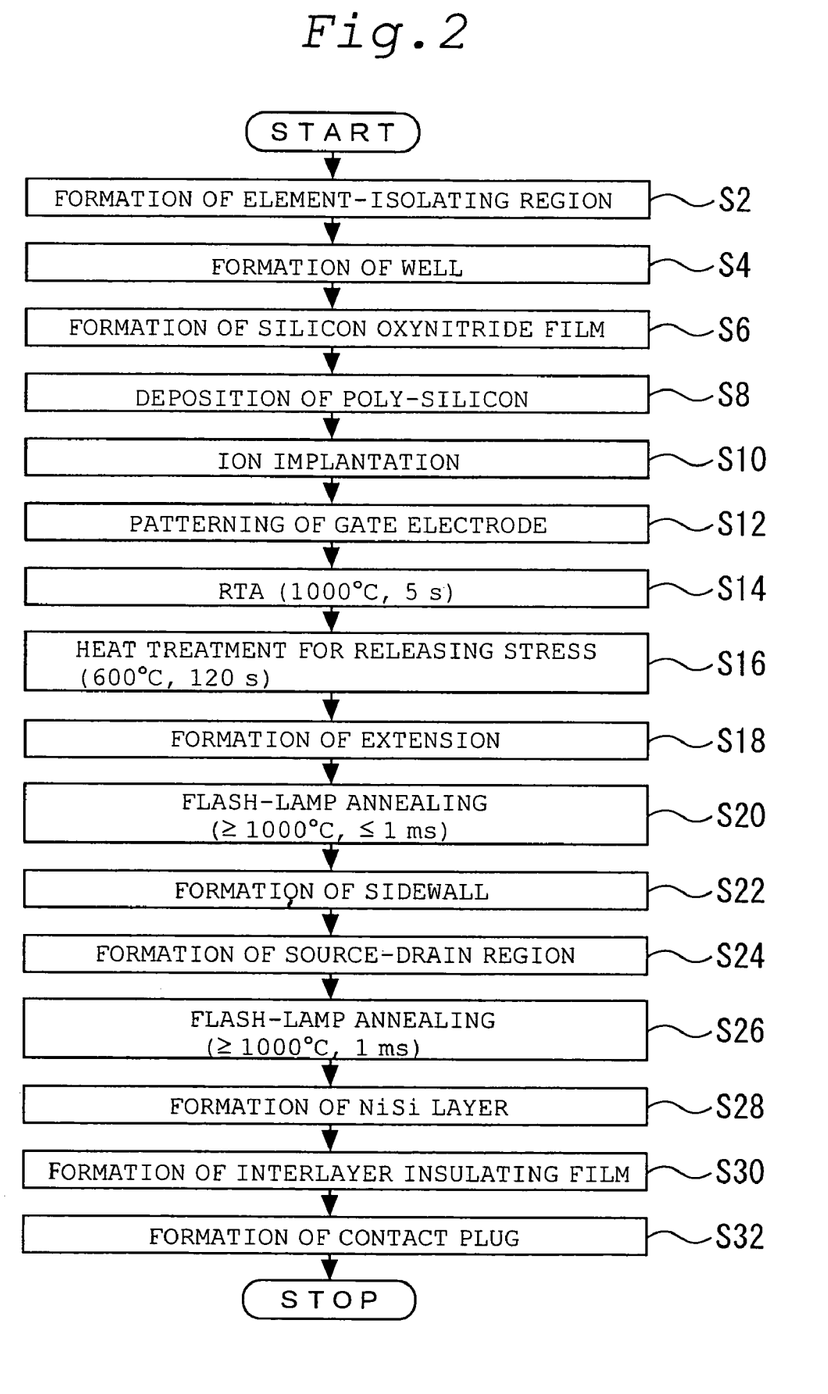
FIG. 2 is a flow diagram for illustrating a method for manufacturing thus constituted semiconductor device according to the first embodiment of the present invention.

FIG. 2 is a flow diagram for illustrating a method for manufacturing thus constituted semiconductor device according to the first embodiment. FIGS. 3 to 8 are schematic sectional views for illustrating the states of the semiconductor device during the manufacturing processes.

The method for manufacturing a semiconductor device in the first embodiment will be specifically described below referring to FIGS. 1 to 8.

Figure 3:
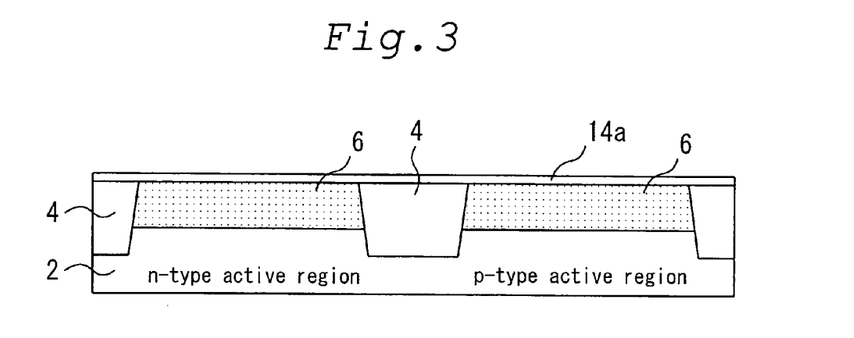
FIGS. 3 to 8 are schematic sectional views for illustrating the states of the semiconductor device during the manufacturing processes.

First, referring to FIG. 3, element-isolating regions 4 are formed on the predetermined portions of an Si substrate 2 (Step S2). Thereafter, B (boron) and P (phosphorus) are implanted into n-MOS and p-MOS regions of Si substrate 2, divided by the element-isolating regions 4, respectively, to form n-type and p-type wells 6 (Step S4). Next, oxidation and nitriding are performed to form an SiON film 14a (Step S6). The SiON film 14a is a material film to become a gate insulation film 14 after processing.

Figure 4:
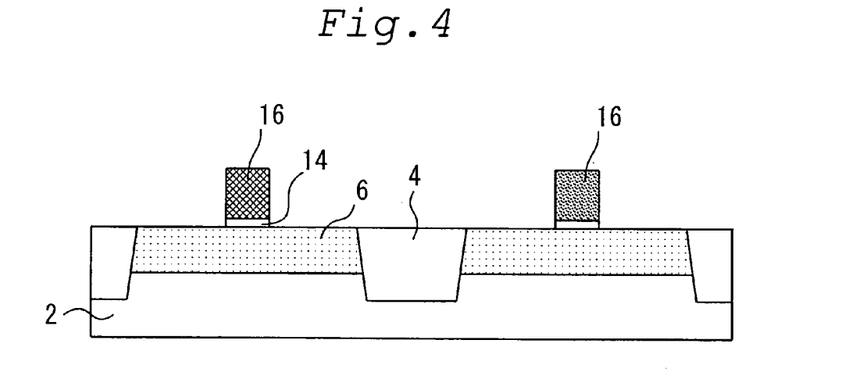

Next, referring to FIG. 4, a poly-Si film is formed on the SiON film 14a on the Si substrate 2 as the material film for the gate electrodes 16 (Step S8). The poly-Si film is formed using a CVD method to have a thickness of about 120 nm. Thereafter, in the poly-Si film of n-MOS and p-MOS regions, P and B are implanted, respectively, for controlling the work function of the gate electrode in each region (Step S10).

Next, the poly-Si film is patterned to have the shape of the gate electrode 16 (Step S12). Here, after forming a resist pattern using lithography, the poly-Si film is etched using the resist pattern to form the gate electrode 16 of a desired shape.

Here, heat treatment is performed for activating the impurities implanted into the gate electrodes (Step S14). Specifically, the heat treatment by RTA is performed at about 1000 degrees centigrade for about 5 seconds. Thereby, the impurities can be sufficiently activated to the vicinities of the gate insulation film.

Next, heat treatment is performed for releasing the stress of the Si substrate 2 produced during RTA (Step S16). Although the temperature of the Si substrate 2 rises and lowers sharply during RTA, since cooling speed differs between the circumference and the center of the Si substrate 2, stress is produced in the Si substrate 2. Therefore, in the first embodiment, heat treatment is performed in the stage immediately after RTA to release the stress. Specifically, the substrate is placed on a hot plate, and the heat treatment is performed at about 600 degrees centigrade for about 120 seconds. In this way, the stress caused in the Si substrate 2 can be released. It has been confirmed that the redistribution and inactivation of the impurities that have been diffused in the gate electrodes does not occur under these conditions of heat-treatment temperature and time.

Figure 5:
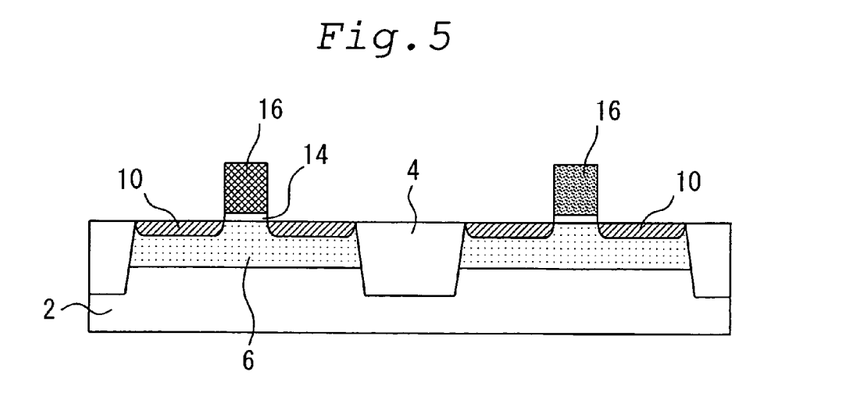

Next, referring to FIG. 5, extensions 10 are formed (Step S18). Here, a resist mask is formed for differentiating ions to be implanted, and As (arsenic) ions are implanted into the Si substrate 2 in n-MOS region, and Ge and B ions are implanted into the Si substrate 2 in p-MOS region, using the resist mask and the gate electrode 16 as masks. Here, the depth of ion implantation into each region is 20 nm or less, and the dose is $2 \times 10^{20}/cm^3$ or more. After implantation, the resist mask is removed. The reason why Ge is implanted into the p-MOS region is that the surface of the diffusion region is previously made amorphous.

Thereafter, light is radiated from a flash lamp (Step S20). By the radiation, heat treatment at a high temperature of about 1000 degrees centigrade for a short time as 1 millisecond or less can be performed on the vicinity of the surface of the Si substrate 2. Thereby, low-resistance extensions 10 with the suppressed diffusion of impurities can be formed.

Figure 6:
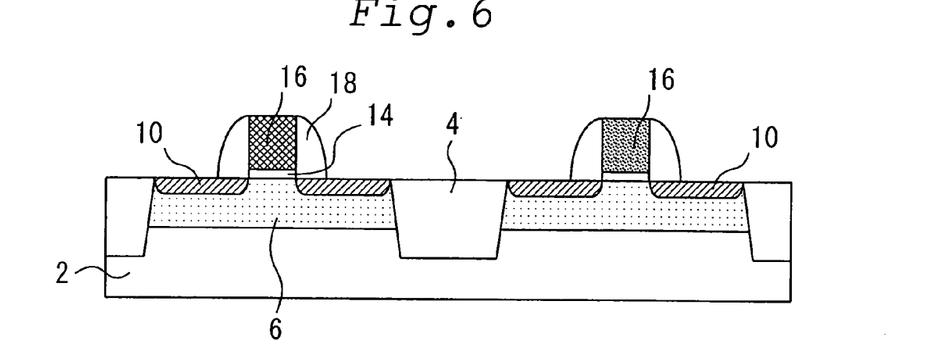

Next, as FIG. 6 illustrates, gate sidewalls 18 are formed on the sides of the gate electrodes 16 and the gate insulation films 14 (Step S22). Here, an oxide film or a nitride film having a thickness of about 30 to 60 nm is first deposited using a CVD method at a low temperature as about 600 degrees centigrade. Thereafter, the oxide film or the nitride film is left only on the sides of the gate electrodes 16 and the gate insulation films 14 by etching back to form the gate sidewalls 18.

In the radiation from the flash lamp (Step S20), a temperature gradient is produced between the surface and the interior of the Si substrate 2. This temperature gradient produces stress in the Si substrate 2 after the radiation from the flash lamp. However, the stress produced by the radiation from the flash lamp can be simultaneously released by the heat of about 600 degrees centigrade during the formation of the oxide film or the like for forming the gate sidewalls 18.

Figure 7:
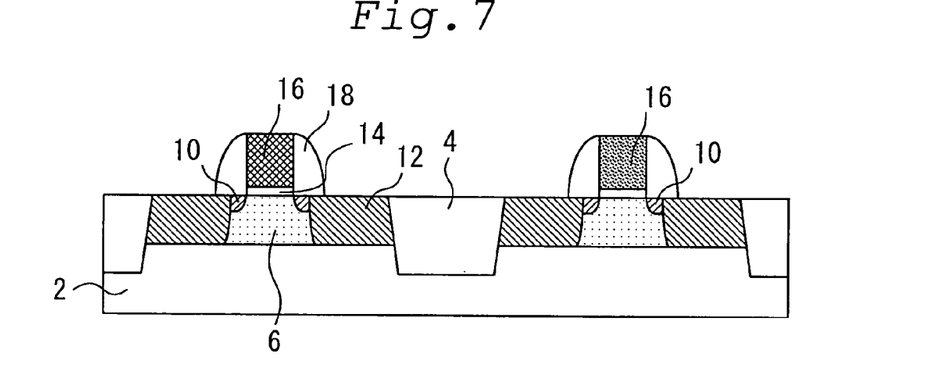

Next, as FIG. 7 illustrates, source-drain regions 12 are formed (Step S24). Here, a resist mask to shield the region wherein no ions are implanted is formed, and As ions and B ions are implanted into the n-MOS and p-MOS regions of the Si substrate 2 using the resist mask, and the gate electrodes 16 and the gate sidewalls 18 as masks (Step S24). Here, the depth of ion implantation into each region is 100 nm or less, and the dose is $2\times10^{20}/cm^3$ or more. After implantation, the resist mask is removed.

Thereafter, light is radiated from a flash lamp (Step S26). By the radiation, heat treatment at a high temperature of about 1000 degrees centigrade for a short time as 1 millisecond or less can be performed on the vicinity of the surface of the Si substrate 2. Thereby, the impurities in the source-drain regions 12 can be activated, and the formation of the diffusion region in each transistor is completed.

Figure 8:
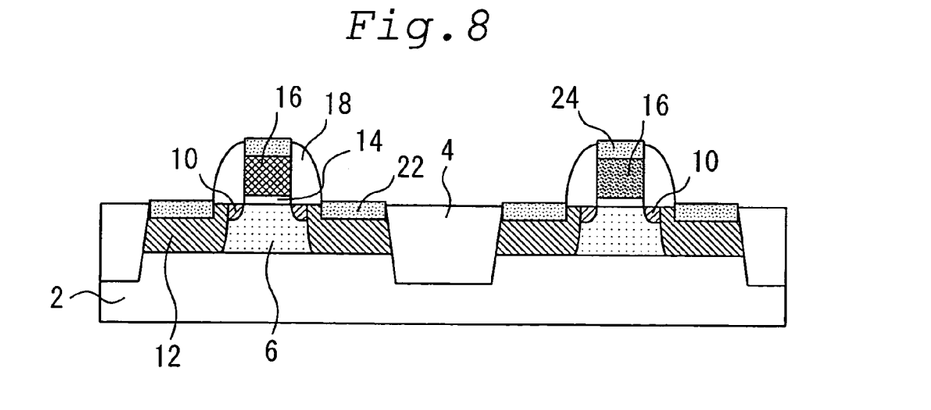

Next, as FIG. 8 illustrates, NiSi layers 24 and 22 are formed on the surfaces of the source-drain regions 12 and the surfaces of the gate electrodes 16 (Step S28). Here, an Ni film is first formed on the top surface of the substrate using a sputtering method. Thereafter, by performing heat treatment at about 450 degrees centigrade, Si reacts with Ni in the portion where Ni and Si contact each other to form NiSi layers 24 and 22. Thereafter, the unreacted Ni film is removed.

Next, an interlayer insulation film 26 is deposited so as to embed the gate insulation films 14, the gate electrodes 16 and the gate sidewalls 18 (Step S30).

Next, contact plugs 28 are formed in the necessary portions (Step S32). In the formation of the contact plugs 28, contact holes are first formed in the necessary portions. Thereafter, barrier metal films consisting of Ti/TiN are formed in the inner walls of the contact holes, and W (tungsten) is embedded. Thereafter, unnecessary W is removed using CMP (chemical mechanical polishing) until the surface or the interlayer insulation film 26 is exposed. Thereby, the contact plugs 28 are formed.

As described above, a semiconductor device as shown in FIG. 1 is manufactured. Thereafter, by forming interlayer insulation films and metal wirings as required, a semiconductor device having a multi-layer wiring structure can be manufactured.

In the first embodiment, as described above, RTA is performed immediately after ion implantation is performed into the material film for the gate electrodes (poly-Si film), followed by heat treatment for releasing the stress of the Si substrate 2 produced during RTA. Therefore, the impurities can be sufficiently diffused in the gate electrode. Since stress of the Si substrate 2 after RTA can be released by the heat treatment performed immediately after RTA, even if annealing for activating the diffusion region is performed using a flash lamp, the occurrence of slipping, damaged or the like in the Si substrate 2 can be suppressed. Thereby, a semiconductor device having good device characteristics can be obtained.

In the first embodiment, the case wherein RTA is performed at 1000 degrees centigrade for about 5 seconds is described. These are conditions that can sufficiently activate impurities in the gate electrodes 16. However, the present invention is not restricted to these temperature and time. These conditions can be adequately determined considering the implanting energy and dose of ions introduced in the gate electrodes 16, the thickness of the gate electrodes 16, or the like.

In the first embodiment, the case wherein the substrate is placed on a hot plate, and heat treatment is performed at about 600 to 650 degrees centigrade for about 120 seconds for the release of the stress after RTA is described. These conditions are preferable for more effectively and sufficiently releasing stress produced during RTA. However, the present invention is not restricted to these conditions of temperature, time, the apparatus, or the like; but these conditions can be optionally determined.

However, the heat-treatment temperature for releasing stress is preferably about 500 to 650 degrees centigrade. The reason for limiting the temperature to 650 degrees centigrade or below is that if the temperature is higher than 650 degrees centigrade, the activation rate of the implanted impurities is considered to lower to the activation rate corresponding to the temperature of heat-treatment for releasing stress, and that if the heat treatment is performed at a temperature of 650 degrees centigrade or below, the redistribution of the impurities, or inactivation of once activated impurities can be suppressed. The reason for limiting the temperature to 500 degrees centigrade or above is that if the heat treatment is performed at a low temperature of 500 degrees centigrade or below, the stress cannot be sufficiently released.

The heat treatment time is preferably 60 seconds or more. If the time is shorter than 60 seconds, the stress cannot be sufficiently released. As in the first embodiment, although the heat treatment for about 120 seconds is considered sufficient, the heat treatment can be performed for longer than 120 seconds. The heat treatment time can be determined considering the conditions such as the heat treatment temperature for releasing stress, the productivity of the semiconductor devices, or the like.

The method for heat treatment is also not limited to the method wherein the substrate is placed on a hot plate, but other methods, such as transferring the substrate into the furnace heated to the required temperature for heat treatment, can also be used.

In the first embodiment, the case of instantaneous high-temperature heat treatment, wherein the heat treatment after the ion implantation into extensions 10, and after ion implantation into source-drain regions 12 is performed using flash-lamp annealing at about 1000 degrees centigrade or above for 1 millisecond or shorter, is described. By thus instantaneously heating only the surface of the Si substrate 2, the impurities can be sufficiently activated while suppressing the diffusion of the impurities, and a shallow diffusion region can be realized. However, the present invention is not limited to the heat treatment using a flash lamp, and the conditions of heat treatment such as temperature and time are not necessarily limited to these values.

In the first embodiment, the case wherein the stress produced during flash-lamp annealing can be released at a film-forming temperature of about 600 degrees centigrade when forming the gate sidewalls is described, but the present invention is not limited thereto. However, in order to release the stress produced during flash-lamp annealing using heat for film forming in the step for forming gate sidewalls, the film forming temperature is preferably 500 to 650 degrees centigrade. If the temperature for forming the gate sidewalls is lower than 500 degrees centigrade, a separate heat-treatment step for releasing stress can be added immediately after flash-lamp annealing. If such an additional heat treatment is performed, the temperature is preferably about 500 to 650 degrees centigrade, and the time is preferably about 60 second or longer. However, the present invention is not restricted to these ranges.

In addition, the kind of each component, the method for forming each component, and ions implanted into each region are not limited to those described for the first embodiment. These can be adequately selected as required.

Second Embodiment

Figure 9:
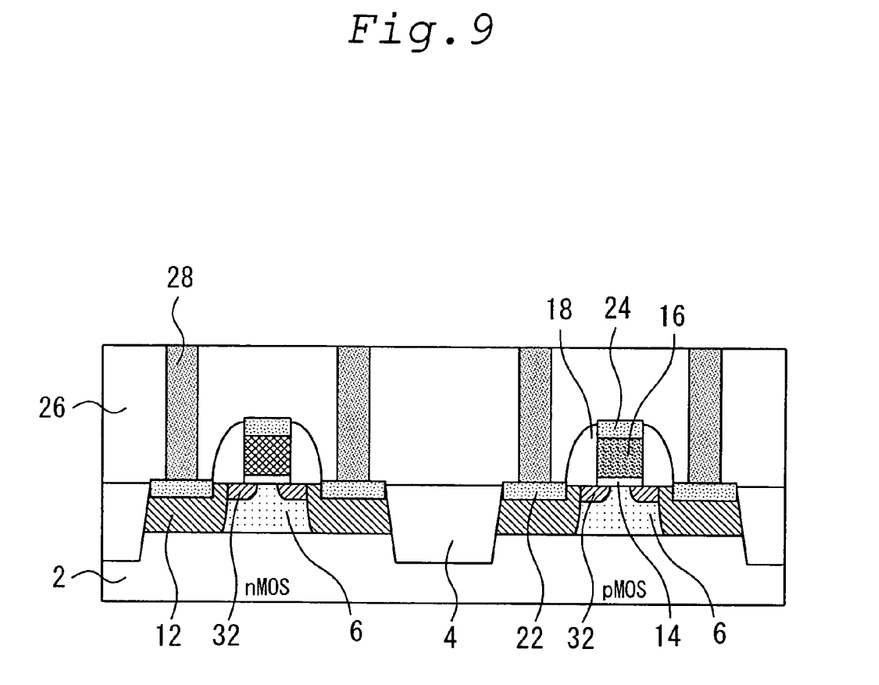
FIG. 9 is a schematic sectional view for illustrating a semiconductor device according to the second embodiment of the present invention.

FIG. 9 is a schematic sectional view for illustrating a semiconductor device according to the second embodiment of the present invention.

As FIG. 9 illustrates the semiconductor device according to the second embodiment is slimier to the semiconductor device shown in schematic sectional views described for the first embodiment. However, in the semiconductor device in the second embodiment, the overlapping portions of the gate electrodes 16 and the extensions 32 are secured to be wider than those in the semiconductor device of the first embodiment. Specifically, in this structure, the extensions 32 extend to the portions immediately under the gate electrodes 16 on the Si substrate 2.

Figure 10:
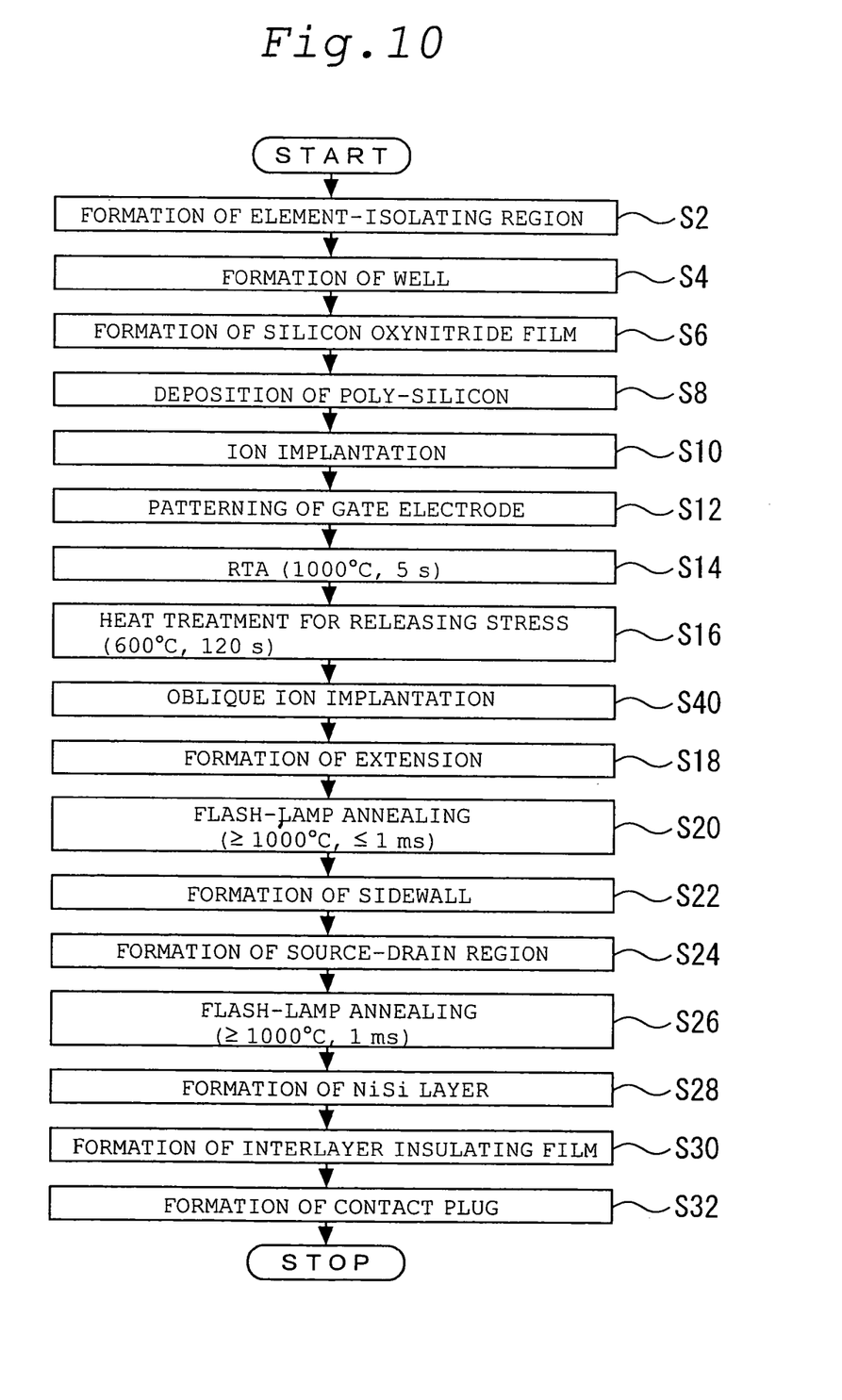
FIG. 10 is a flow diagram for illustrating a method for manufacturing thus constituted semiconductor device according to the second embodiment of the present invention.
Figure 11:
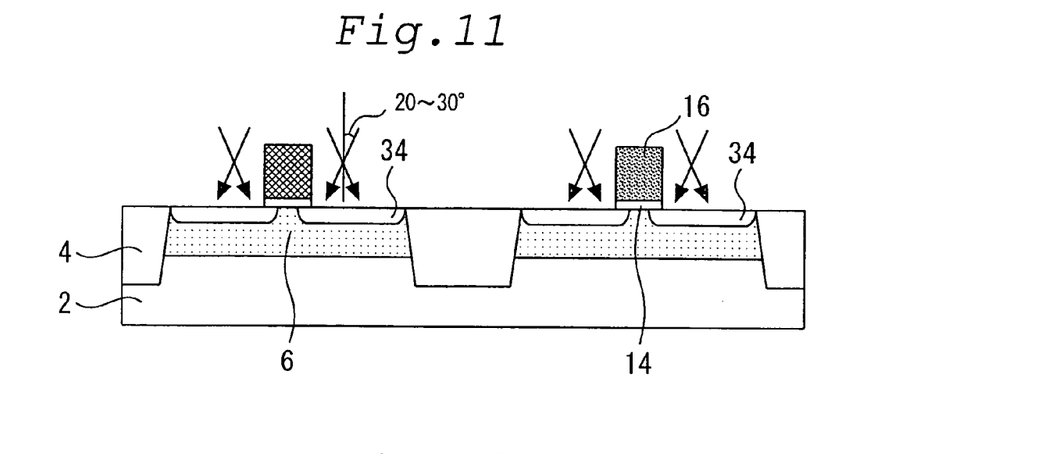
FIGS. 11 to 13 are schematic sectional views for illustrating the states of the semiconductor device during the manufacturing processes in the second embodiment of the present invention.
Figure 12:
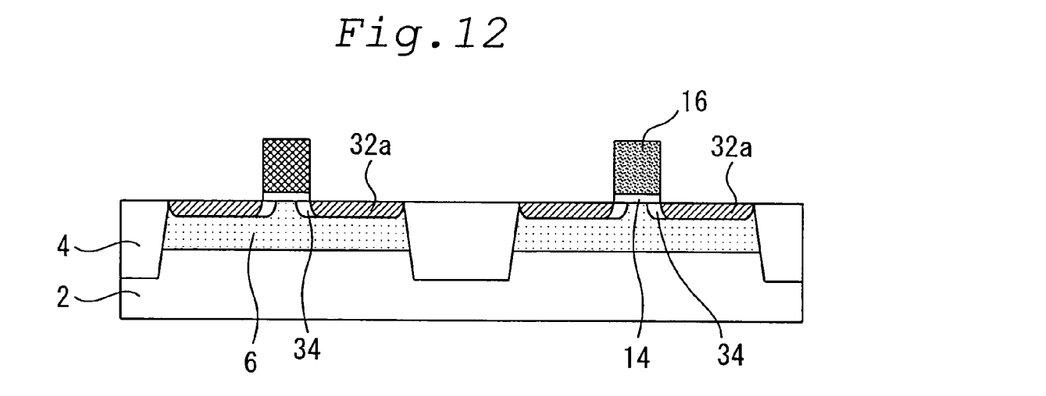
Figure 13:
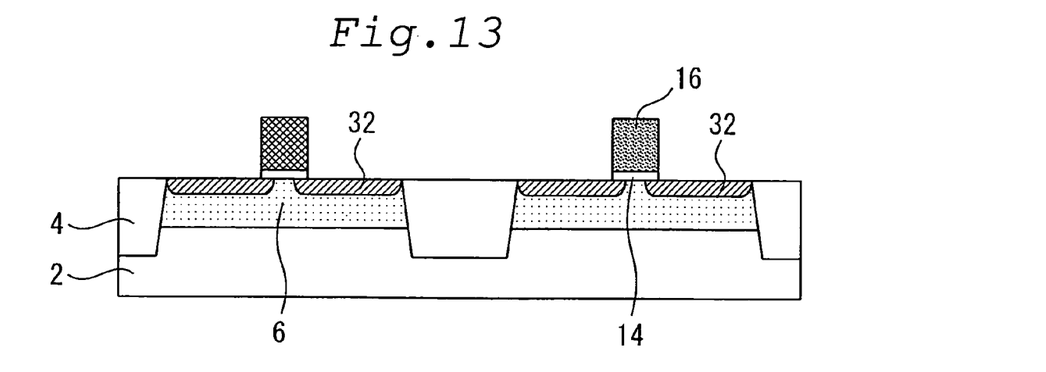

FIG. 10 is a flow diagram for illustrating a method for manufacturing thus constituted semiconductor device according to the second embodiment. FIGS. 11 to 13 are schematic sectional views for illustrating the states of the semiconductor device during the manufacturing processes in the second embodiment.

The method for manufacturing a semiconductor device in the second embodiment will be specifically described below referring to FIGS. 10 to 13.

First, in the same manner as in Steps S2 to S16 in the first embodiment, a gate insulation film 14 and a gate electrode 16 are formed in each region, RTA are performed for activating impurities implanted into the gate electrodes 16, and then, heat treatment for releasing stress due to RTA is performed.

Next, Ge ions are implanted into the regions for forming extensions 32 using the gate electrodes 16 as masks (Step S40). The energy for ion implantation is about 10 keV, the dose is about $1 \times 10^{15}/cm^3$. Ge ions are obliquely implanted from right and left at an angle of about ±20 to 30 degrees to the direction normal to the Si substrate 2. In order to form the extensions 32 symmetrically, the ion implantation is performed at least from the both side of the gate electrodes 16. Thereby, an amorphous silicon layer 34 is formed on the surface of the Si substrate 2. Since Ge ions are obliquely implanted, the amorphous silicon layer 34 is formed in the state extending to some extent to the portion immediately under the gate electrodes 16 on the Si substrate 2.

Next, As ions and B (or $BF_2$) ions are implanted into the p-MOS and n-MOS regions, respectively, using a photoresist (Step S18). Thereby, extensions 32a before activating the impurities are formed. Here, the ion implantation is performed in the direction normal to the substrate as in the first embodiment. The implantation depth into each region is 20 nm or shallower, and the dose is $2 \times 10^{20}/cm^3$ or more.

Next, in the same manner as in the first embodiment, annealing is performed using a flash lamp (Step S20). Thereby, ions implanted into the extension regions are activated. An amorphous silicon layer 34 is previously formed in the regions for forming extensions, and the amorphous silicon layer 34 is formed in the state extending immediately under the gate electrodes 16 of the Si substrate 2. By this flash-lamp annealing, the impurities are diffused into a part of the amorphous silicon layer 34. Thereby, extensions 32 extending immediately under the gate electrodes 16 to some extent and diffused into the gate electrodes 16 are formed.

Thereafter, in the same manner as in S22 to S32 in the first embodiment, gate sidewalls 18, source-drain regions 12, the interlayer insulation film 26, contact plugs 28 and the like are formed to manufacture a semiconductor device as illustrated in FIG. 9.

As described above, in the second embodiment, impurities are sufficiently diffused using RTA immediately after implanting the impurities into the gate electrodes 16. Thereafter, heat treatment is performed for releasing stress. Therefore, in the subsequent flash-lamp annealing or the like, the impurities can be sufficiently diffused into the gate electrodes 16 and the impurities in the diffusion region can be sufficiently activated while suppressing the occurrence of the defects of the Si substrate 2 such as slipping.

By performing heat treatment using flash-lamp annealing, the diffusion of the impurities into extensions can be surely suppressed. In this case, however, it is considered that the required overlapping region cannot be secured between the gate electrode and the extension.

Therefore, in the second embodiment, an amorphous silicon layer 34 is formed prior to ion implantation for forming extensions 32. The amorphous silicon layer 34 is formed so as to extend under the gate electrodes 16 by oblique ion implantation. Thereafter, the impurities implanted for forming the extensions 32 are diffused in a part of the amorphous silicon layer 34 by performing flash-lamp annealing. Therefore, the extensions 32 can be formed so as to diffuse into the area under the gate electrodes 16. Specifically, required overlapping regions of the gate electrodes 16 and extensions 32 can be secured. Therefore, the process margin of flash-lamp annealing described for the first embodiment can be further enlarged.

In the second embodiment, it is described that the angle of oblique ion implantation for forming the amorphous silicon layer 34 is about 20 to 30 degrees to the direction normal to the surface of the Si substrate 2. This has been determined considering the overlapping quantity of the gate electrodes 16 and the extensions 32. However, in the present invention, the angle of ion implantation is not restricted to this range, but can be adequately determined considering the required overlapping quantity in each semiconductor device, and the conditions such as the energy of ion implantation.

In the second embodiment, the case wherein Ge ions are used for forming the amorphous silicon layer 34 is described. However, in the present invention, ions used for forming the amorphous silicon layer is not limited to Ge ions, but other ions can be used as long as the surface of the Si substrate 2 is made amorphous. As such ions, for example, the use of Si, other than Ge ions, can be considered.

Furthermore, the kinds of each component, the method for forming such components, or ions implanted into each region are not limited to those described for the second embodiment. These can be adequately selected as required.

Since others are the same as in the first embodiment, the description thereof will be omitted.

For example, in the first and second embodiments, by carrying out Steps S6 to S12, the "gate-forming step" in the present invention is carried out; and by carrying out Step S10, the "first impurity implanting step" is carried out. For example, in the first and second embodiments by carrying out Steps S14 and S16, the "first heat-treatment step" and the "second heat-treatment step" are carried out, respectively; by carrying out Step S18, the "second impurity implanting step" is carried out; by carrying out Step S20 or S26, the "third heat-treatment step" is carried out; by carrying out Step S22, the "gate sidewall forming step" is carried out; and by carrying out Step S24, the "third impurity implanting step" is carried out. In the second embodiment, by carrying out Step S40, the "amorphous step" of the present invention is carried out.

The features and the advantages of the present invention as described above may be summarized as follows.

According to one aspect of the present invention, immediately after implanting an impurity in the material film of the gate electrode, a first heat treatment is performed at a high temperature, and a second heat treatment is performed for releasing stress. Thereafter, an impurity is implanted for forming a diffusion region, and a third heat treatment is performed at a high temperature for a short time. Here, stress in the Si substrate produced during the first heat treatment is released during the second heat treatment. Therefore, even if the third heat treatment is performed at a high temperature for a short time, the impurity can be sufficiently diffused or activated while suppressing the defect such as slipping in the Si substrate, the damage to the Si substrate or the like. Thereby, a semiconductor device having good device characteristics can be obtained.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2004-200443, filed on Jul. 7, 2004 including specification, claims, drawings and summary, on which the Convention priority of the present application is based, are incorporated herein by reference in its entirety.

What is claimed is:

1. A method of manufacturing a semiconductor device comprising, sequentially:
   forming a gate insulation film and a gate electrode on a substrate;
   implanting an impurity into said gate electrode;
   activating the impurity in said gate electrode;
   after activating the impurity in said gate electrode, heat treating to release stress generated in said substrate in activating the impurity in said gate electrode;
   implanting an impurity into said substrate to form a first implanted region, using said gate electrode as a mask; and
   activating the impurity implanted into said first implanted region.

2. The method of manufacturing a semiconductor device according to claim 1, further comprising, after activating the impurity implanted in said first implanted region:
   forming a gate sidewall on the side of said gate electrode at a temperature of 500 to 650° C.; and
   implanting an impurity into said substrate to form a second implanted region, using said gate electrode and said sidewall as masks.

3. The method of manufacturing a semiconductor device according to claim 2, including
   activating the impurity in said gate electrode by rapid thermal annealing;
   releasing the stress in said substrate by the heat treating at 500 to 650° C. for at least 60 seconds; and
   activating the impurity in the first implanted region using a flash lamp.

4. The method of manufacturing a semiconduetor device according to claim 2, further comprising, before forming said first implanted region, forming an amorphous region on an area to become said first implanted region, by implanting ions obliquely into said substrate, using said gate electrode as a mask.

5. The method of manufacturing a semiconductor device according to claim 4, including forming said amorphous region by implanting ions at a gradient of about 20 to 30 degrees to a direction normal to said substrate.

6. The method of manufacturing a semiconductor device according to claim 1, including
   activating the impurity implanted in said gate electrode by rapid thermal annealing;
   releasing the stress in said substrate by the heat treating at 500 to 650° C. for at least 60 seconds; and
   activating the impurity in the first implanted region using a flash lamp.

7. The method of manufacturing a semiconductor device according to claim 1, further comprising, before forming said first implanted region, forming an amorphous region on an area to become said first implanted region, by implanting ions obliquely into said substrate, using said gate electrode as a mask.

8. The method of manufacturing a semiconductor device according to claim 7, including forming said amorphous region by implanting ions at a gradient of about 20 to 30 degrees to a direction normal to said substrate.

* * * * *